US 6,307,243 B1

(12) United States Patent
Rhodes (10) Patent No.: US 6,307,243 B1
(45) Date of Patent: Oct. 23, 2001

(54) MICROLENS ARRAY WITH IMPROVED FILL FACTOR

(75) Inventor: Howard E. Rhodes, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/357,168

(22) Filed: Jul. 19, 1999

(51) Int. Cl.⁷ .................... H01L 27/148; H01L 29/768
(52) U.S. Cl. .................... 257/432; 257/232; 257/233
(58) Field of Search .................... 257/232, 233, 257/432

(56) References Cited

U.S. PATENT DOCUMENTS

| 5,118,924 | * | 6/1992 | Mehra et al. ................... 250/211 J |
| 5,298,366 | | 3/1994 | Iwasaki et al. . |
| 5,300,263 | | 4/1994 | Hoopman et al. . |
| 5,384,231 | | 1/1995 | Johnson et al. . |
| 5,420,634 | | 5/1995 | Matsumoto . |
| 5,453,876 | | 9/1995 | Hamada . |
| 5,479,049 | * | 12/1995 | Aoki et al. ................... 257/462 |
| 5,559,336 | | 9/1996 | Kosai et al. . |
| 5,610,390 | | 3/1997 | Miyano . |
| 5,666,175 | | 9/1997 | Spitzer et al. . |
| 5,693,967 | | 12/1997 | Park et al. . |
| 5,701,008 | | 12/1997 | Ray et al. . |
| 5,796,154 | * | 8/1998 | Sano et al. ................... 257/432 |
| 5,844,289 | * | 12/1998 | Teranishi et al. ................... 257/432 |
| 6,040,591 | * | 3/2000 | Otsuka ................... 257/232 |
| 6,104,021 | * | 8/2000 | Ogawa ................... 250/208.1 |
| 6,171,883 | * | 1/2001 | Fan et al. ................... 438/65 |

* cited by examiner

Primary Examiner—Ngân V. Ngô
(74) Attorney, Agent, or Firm—Dickstein Shapiro Morin & Oshinsky LLP (57) ABSTRACT

A microlens array for use in a solid-state imager having an improved fill factor. The microlens array includes a plurality of microlenses, each consisting of two layers: a lower refractive layer, and an upper insulation layer. The refractive layer is formed of transparent material with a suitable refractive index which may be optical thermoplastic, polyimide, thermoset resin, photosensitive gelatin, or radiation curable resin. The insulation layer is formed of transparent insulating material such as silicon oxide, silicon nitride, or silicon oxynitride. Due to the refraction of light through the insulation layer, more light at the pixel edges is captured by each microlens, thereby improving the fill factor of the microlens array. Also disclosed are methods for forming the microlens array.

59 Claims, 5 Drawing Sheets

MICROLENS ARRAY WITH IMPROVED FILL FACTOR

FIELD OF THE INVENTION

The present invention relates generally to a microlens array for use in a solid-state image sensor and in particular to a microlens array having an improved fill factor, and a method for producing the same.

BACKGROUND OF THE INVENTION

Solid-state image sensors, also known as imagers, were developed in the late 1960s and early 1970s primarily for television image acquisition, transmission, and display. An imager absorbs incident radiation of a particular wavelength (such as optical photons, x-rays, or the like) and generates an electrical signal corresponding to the absorbed radiation. There are a number of different types of semiconductor-based imagers, including charge coupled devices (CCDs), photodiode arrays, charge injection devices (CIDs), hybrid focal plan arrays, and CMOS imagers. Current applications of solid-state imagers include cameras, scanners, machine vision systems, vehicle navigation systems, video telephones, computer input devices, surveillance systems, auto focus systems, star trackers, motion detector systems, image stabilization systems and data compression systems for high-definition television.

These imagers typically consist of an array of pixel cells containing photosensors, where each pixel produces a signal corresponding to the intensity of light impinging on that element when an image is focused on the array. These signals may then be used, for example, to display a corresponding image on a monitor or otherwise used to provide information about the optical image. The photosensors are typically phototransistors, photoconductors or photodiodes, where the conductivity of the photosensor or the charge stored in a diffusion corresponds to the intensity of light impinging on the photosensor. The magnitude of the signal produced by each pixel, therefore, is proportional to the amount of light impinging on the photosensor.

It is known in the art to use a microlens array with an imager array, wherein the microlens array comprises a convex microlens for each pixel. The microlenses refract incident radiation from the circuitry region of the pixel to the photosensor region, thereby increasing the amount of light reaching the photosensor and thereby increasing the fill factor of the pixels. Other uses of microlens arrays include intensifying illuminating light on the pixels of a nonluminescent display device such as a liquid crystal display device to increase the brightness of the display, forming an image to be printed in a liquid crystal or light emitting diode printer, and as focusing means for coupling a luminescent device or a receptive device to an optical fiber.

Despite the use of microlens arrays, a large amount of light incident on an imager is not directed onto the photosensor due to the geometry of the microlens array. In particular, light incident on the space between individual lenses (the lens-lens space), and on the edges of the pixel beyond the edges of an individual lens remains uncaptured by the microlens, and never impacts the photosensor. Additionally, the typical practice of forming the microlens array on a separate substrate from the pixel array leads to problems of lens-pixel alignment that results in additional lost light.

There is needed, therefore, a microlens array having an improved fill factor formed on the same substrate as a pixel array. A simple method of fabricating a microlens array having an improved fill factor is also needed.

SUMMARY OF THE INVENTION

The present invention provides a microlens array for use in a solidstate imager having a pixel array, wherein each microlens of the microlens array may correspond to a pixel cell of the imager pixel array. Each microlens consists of two layers: a lower refractive layer, and an upper insulation layer. The refractive layer is formed of transparent material with a suitable refractive index, which may be an optical thermoplastic such as polymethylmethacrylate, polycarbonate, polyolefin, cellulose acetate butyrate, or polystyrene, a polyimide, a thermoset resin such as an epoxy resin, a photosensitive gelatin, or a radiation curable resin such as acrylate, methacrylate, urethane acrylate, epoxy acrylate, or polyester acrylate. The insulation layer is radiation-transparent and assists in capturing light at the edges of the pixel, thereby improving the fill factor of the microlens array. Suitable materials for the insulation layer include silicon insulators such as silicon oxide, silicon nitride, or silicon oxynitride that have been formed by a low temperature process. Also provided are methods for forming the microlens array of the present invention.

Additional advantages and features of the present invention will be apparent from the following detailed description and drawings which illustrate preferred embodiments of the invention.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide. The term "pixel" refers to a picture element unit cell containing a photosensor and transistors for converting electromagnetic radiation to an electrical signal. For purposes of illustration, a representative CMOS imager pixel is illustrated in the figures and description herein. However, this is just one example of the type of imagers and pixel cells thereof with which the invention may be used. The following detailed description is, therefore, not to be taken in a limiting sense, and the scope of the present invention is defined by the appended claims.

Figure 1:
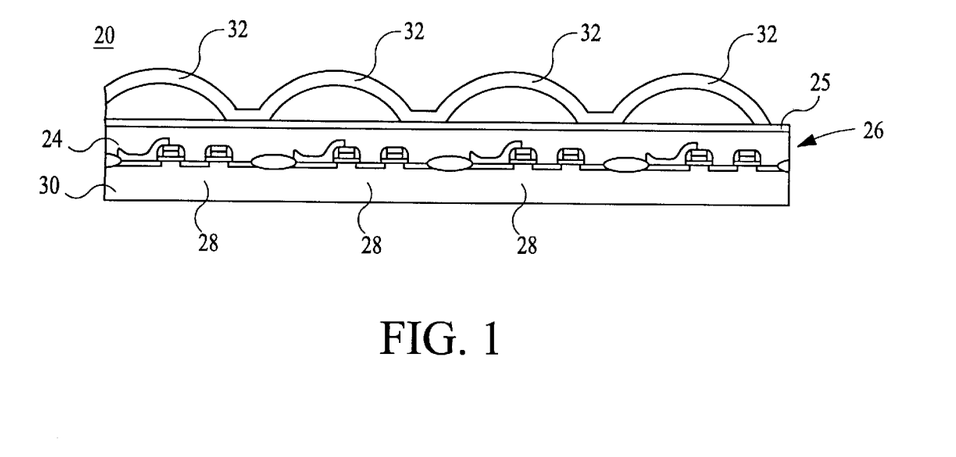
FIG. 1 is a side cross-sectional view showing the principal elements of a solid-state imager having a microlens array according to one embodiment of the present invention.
Figure 2:
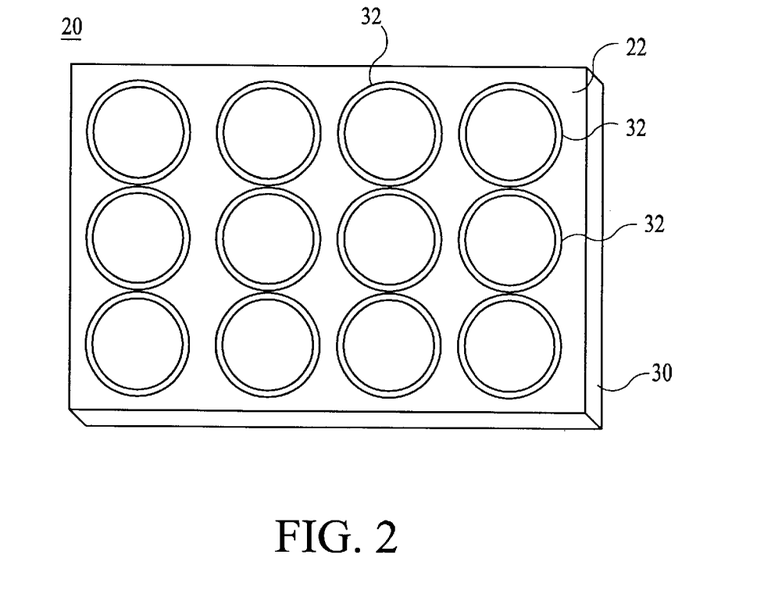
FIG. 2 is a top view of the microlens array of FIG. 1.

Referring now to the drawings, where like elements are designated by like reference numerals, a solid-state imager 20 containing an embodiment of the microlens array 22 of the present invention is shown in FIGS. 1 and 2. The imager 20 comprises a microlens array or light condensing layer 22 formed over a pixel array 26 as part of the same substrate 30, which may be any of the types of substrate described above. The pixel array 26 is comprised of a plurality of pixel sensor cells 28 formed in the substrate, and is covered by a protective layer 24 that acts as a passivation and planarization layer for the imager 20. Protective layer 24 may be a layer of BPSG, PSG, BSG, silicon dioxide, silicon nitride, polyimide, or other well-known light transmissive insulator. The microlens array or light condensing layer 22 is formed on the protective layer 24, and is comprised of a plurality of microlenses 32. In a preferred embodiment, depicted in FIGS. 1 and 2, the microlens array 22 is formed so that a microlens 32 is formed above each pixel cell 28. The microlens array 22 is formed such that the focal point of the array is centered over the photosensitive elements in each pixel cell 28. The device also includes a spacer layer 25 under the mircolens array 22. The thickness of spacer layer 25 is adjusted such that the photosensitive element is at a focal point for the light traveling through microlens array 22. The spacer layer 25 may have a thickness of from about 1 μm to about 20 μm. If desired, a color filter, fluorescent material film, or other device for converting the wavelength of incident light may be used with the pixel array 26 by placing the device on top of the protective layer 24 and beneath the microlens array 22.

Figure 3:
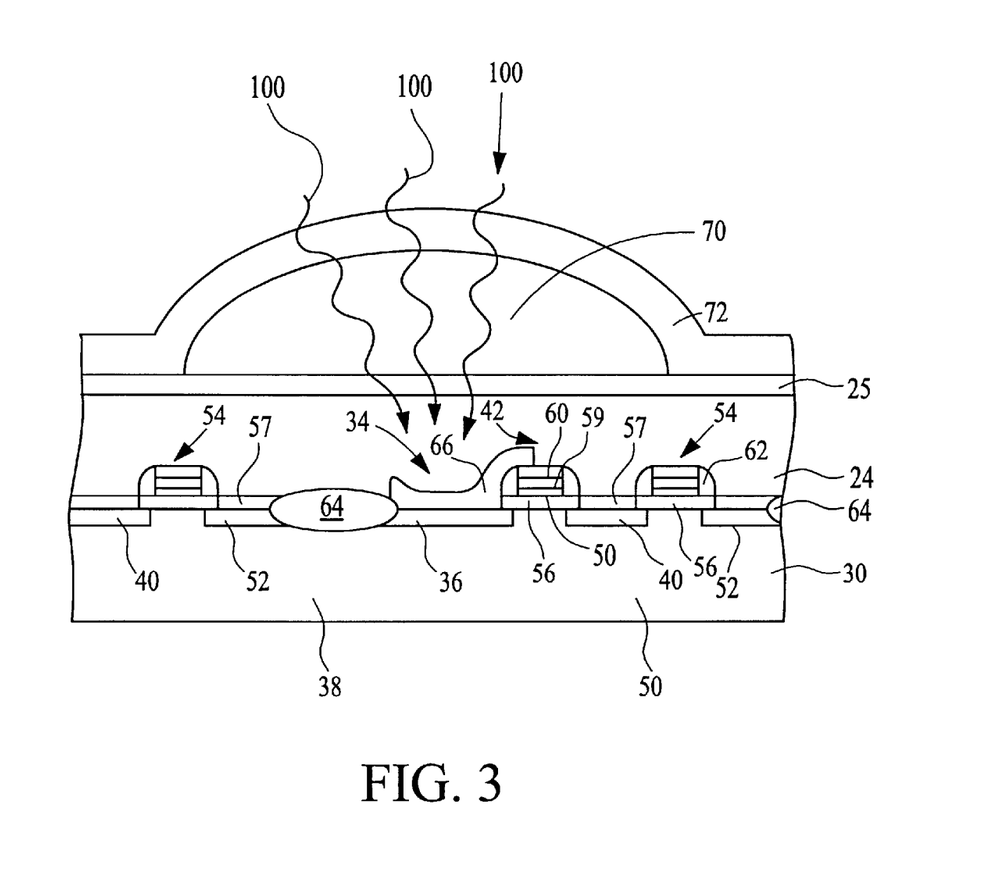
FIG. 3 is a cross-sectional view of a CMOS imager pixel cell having a microlens constructed in accordance with an embodiment of the present invention.
Figure 4:
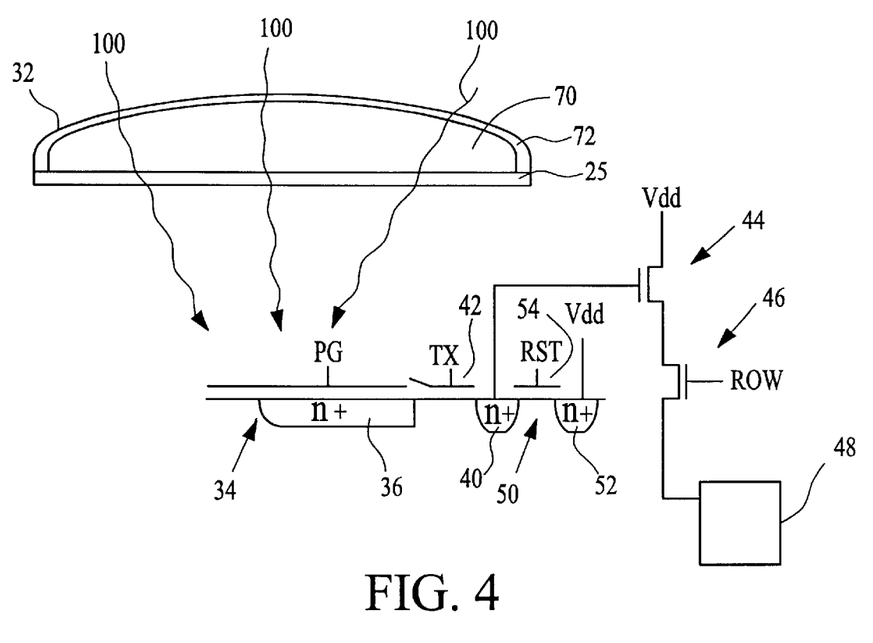
FIG. 4 is a representative diagram of the CMOS imager pixel cell of FIG. 3.

As can be seen in FIGS. 3 through 4, each pixel sensor cell 28 contains a photosensor 34, which may be a photodiode, photogate, or the like. A photogate photosensor 34 is depicted in FIGS. 3 through 4. An applied control signal PG is applied to the photogate 34 so that when incident radiation 100 in the form of photons strikes the photosensor 34 the photo-generated electrons accumulate in the doped region 36 under the photosensor 34. A transfer transistor 38 is located next to the photosensor 34, and has source and drain regions 36, 40 and a gate stack 42 controlled by a transfer signal TX. The drain region 40 is also called a floating diffusion region or a floating diffusion node, and it passes charge received from the photosensor 34 to output transistors 44, 46 and then to readout circuitry 48. A reset transistor 50 comprised of doped regions 40, 52 and gate stack 54 is controlled by a reset signal RST which operates to reset the floating diffusion region 40 to a predetermined initial voltage just prior to signal readout.

As can best be seen in FIG. 3, the gate stacks 42, 54 of the pixel cell 28 include a silicon dioxide or silicon nitride insulator 56 on the substrate 30, which in this example is a p-type substrate, a conductive layer 58 of doped polysilicon, tungsten, or other suitable material over the insulating layer 56, and an insulating cap layer 60 of, for example, silicon dioxide, silicon nitride, or ONO (oxide-nitride-oxide). A silicide layer 59 may be used between the polysilicon layer 58 and the cap 60, if desired. Insulating sidewalls 62 are also formed on the sides of the gate stacks 42, 54. These sidewalls may be formed of, for example, silicon dioxide, silicon nitride, or ONO. A field oxide layer 64 around the pixel cell 28 serves to isolate it from other pixel cells in the array. A second gate oxide layer 57 may be grown on the silicon substrate and the photogate semi-transparent conductor 66 is patterned. In the case that the photosensor is a photodiode, no second gate oxide layer 57 and no photogate semi-transparent conductor 66 is required. Furthermore, for the case of a photodiode, a transfer gate is optional.

Figure 5:
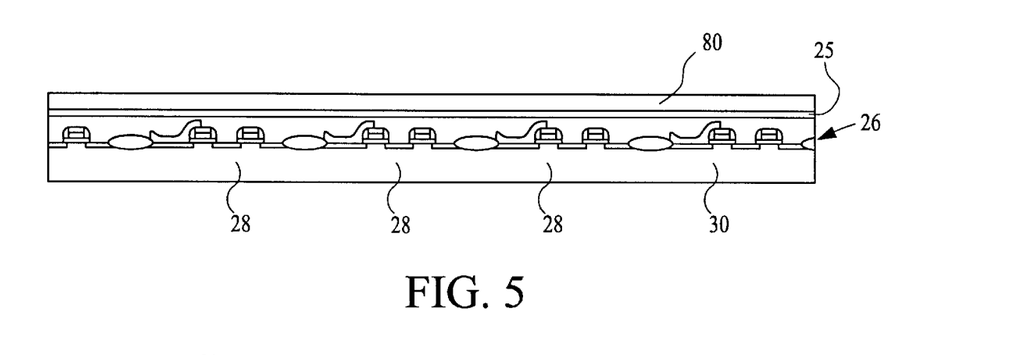
FIG. 5 is a cross-sectional view of a semiconductor wafer undergoing the process of a preferred embodiment of the invention.

The microlens array 22 of a preferred embodiment is formed so that a microlens 32 is formed above each pixel cell 28, as can be seen in FIGS. 3 through 5. The microlens 32 has three transparent layers, a refractive layer 70 and an insulation layer 72 and spacer layer 25. The refractive layer 70 is fashioned from transparent material with a suitable refractive index which may be an optical thermoplastic such as polymethylmethacrylate, polycarbonate, polyolefin, cellulose acetate butyrate, or polystyrene, a polyimide, a thermoset resin such as an epoxy resin, a photosensitive gelatin, or a radiation curable resin such as acrylate, methacrylate, urethane acrylate, epoxy acrylate, or polyester acrylate. The insulation layer 72 is also transparent, and is made from a silicon insulator such as silicon oxide, silicon nitride, or silicon oxynitride that has been formed by a low temperature process, such as a plasma enhanced chemical vapor deposition process conducted at a temperature within the range of approximately 200 to 400 degrees Celsius. The shape of the microlens 32 as seen from above may be circular, lenticular, ovoid, rectangular, hexagonal or any other suitable shape.

The microlens 32 operates to refract incident radiation 100 from the circuitry region of the pixel cell 28 to the photosensor region. As can be seen in FIG. 3, the microlens 32 is a plano-convex lens having a generally semi-circular cross-section. Light radiation 100 is typically perpendicularly incident to the pixel cell 28, and if no microlens were used, light radiation not directed at the photosensor 34 would not ever strike it, i.e., light radiation directed at the reset gate 54, for example, would strike the reset gate 54 and not the photosensor 34. Use of a microlens, which because of its convex shape acts to condense or focus incident radiation 100 into a smaller area than that of the microlens 32, enables light radiation not originally directed at the photosensor 34 to be redirected towards the photosensor 34. For example, light radiation 100 incident on an outer edge of the microlens 32 is refracted as it passes through the microlens towards the optical axis of the microlens 32, which is positioned over the photosensor 34, and therefore strikes the photosensor 34, whereas an unrefracted beam would not strike the photosensor 34.

As pixel sensor cells 28 decrease in size due to the demand for increased array density, complications in conventional photolithography and other patterning processes result in the formation of conventional microlenses that do not completely cover the pixel sensor cell 28. This can be seen mostly clearly in FIG. 3, wherein the refractive layer 70 extends across a large portion of the pixel cell 28, but due to the limitations of the patterning process does not cover the entire pixel cell 28. The present invention provides an insulation layer 72 covering the refractive layer 70, thereby effectively expanding the area of the pixel cell 28 that is covered by a refractive surface, so that a greater proportion of radiation incident on the pixel cell 28 is directed to the photosensor 34, thereby improving the fill factor of the pixel sensor cell 28. The microlens array 22 can be used in a CMOS imager 20, as is shown in FIGS. 1, 3 and 4, or may be used in a CCD imager.

The microlens array 22 is manufactured through a process described as follows, and illustrated by FIGS. 5 through 8. Referring now to FIG. 5, a substrate 30, which may be any of the types of substrates described above, having a pixel array 26, peripheral circuits, contacts and wiring formed thereon by wellknown methods, is provided. A protective layer 24 of BPSG, BSG, PSG, silicon dioxide, silicon nitride or the like is formed over the pixel array 26 to passivate it and to provide a planarized surface. A spacing layer 25 is formed over the protective layer 24. A lens forming layer 80 is formed on the spacer layer 25 by spin-coating or other suitable means. The lens forming layer 80 may be an optical thermoplastic such as polymethylmethacrylate, polycarbonate, polyolefin, cellulose acetate butyrate, or polystyrene, a polyimide, a thermoset resin such as an epoxy resin, a photosensitive gelatin, or a radiation curable resin such as acrylate, methacrylate, urethane acrylate, epoxy acrylate, or polyester acrylate.

Figure 6:
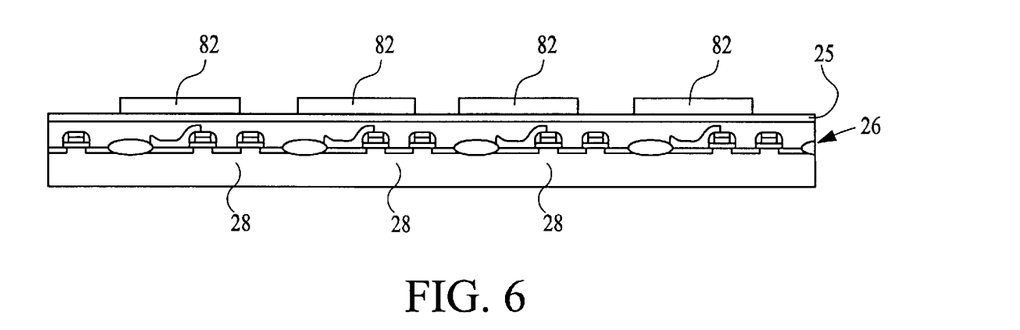
FIG. 6 shows the wafer of FIG. 5 at a processing step subsequent to that shown in FIG. 5.

Next, as shown in FIG. 6, the lens forming layer 80 is patterned by conventional photolithography, or other suitable means, to form a plurality of lens forming regions 82. In the exemplary embodiment illustrated, each lens forming region 82 overlies a pixel cell 28, although alternative constructions in which a lens forming region 82 overlies multiple pixel cells 28 are foreseen. The shape of the lens forming regions 82 as seen from above may be circular, lenticular, ovoid, rectangular, hexagonal or any other suitable shape.

Figure 7:
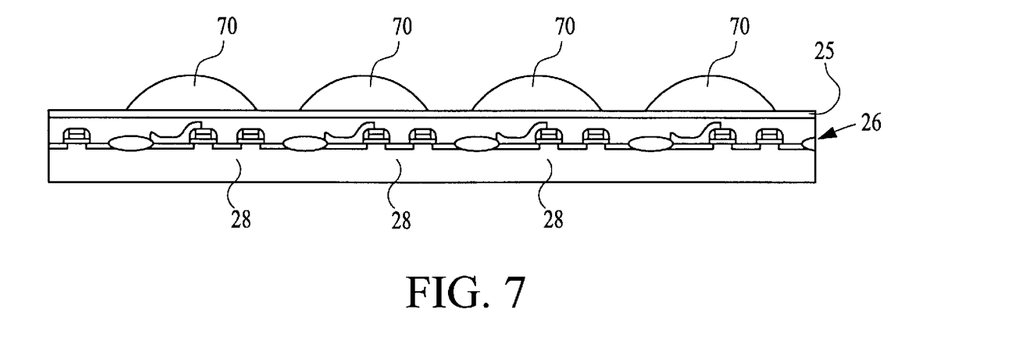
FIG. 7 shows the wafer of FIG. 5 at a processing step subsequent to that shown in FIG. 6.

Referring now to FIG. 7, the substrate 30 is then treated, by heat treatment or other suitable treatment, to form refractive lenses 70 from the lens forming regions 82. The treatment used to form the refractive lenses 70 depends on the material used to form the lens forming layer 80. If the material of the lens forming layer 80 may be heat treated, then heat treatment processes such as baking may be used. If the material is extremely photosensitive, then special light exposure techniques may be used, as further described below.

Heat treatment relies on the use of flowable materials such as optical thermoplastics, polyimides, and thermoset resins, which may be melted at relatively low temperatures to produce a smooth-surfaced lens. A typical baking process involves heating the substrate 30 at a temperature of approximately 100 to 350 degrees Celsius for a suitable length of time, such as 30 minutes. As a result of the heat applied, the lens forming regions 82 melt and surface tension in the resultant liquid results in the formation of a smooth convex lens 70 with a semi-circular cross-section.

Certain photosensitive materials such as gelatin and radiation curable resins exhibit a phenomenon in which, when selectively exposed to light, unreacted compounds move from the unexposed regions to the exposed regions, resulting in a swelling of the exposed regions. This phenomenon may be used to form refractive lenses 70 from the lens forming regions 82. The lens forming regions 82 are selectively illuminated with light from a mercury lamp or the like through the top or bottom of the substrate, which has been masked with a photomask or other suitable device for creating a lens pattern. The illumination time depends on the thickness of the lens forming regions 82, the degree of parallelism of the light beams, and the intensity of the light used, but should be sufficient to cause the lens forming regions 82 to swell into smooth convex lenses 70 having a generally semi-circular cross-section.

Figure 8:
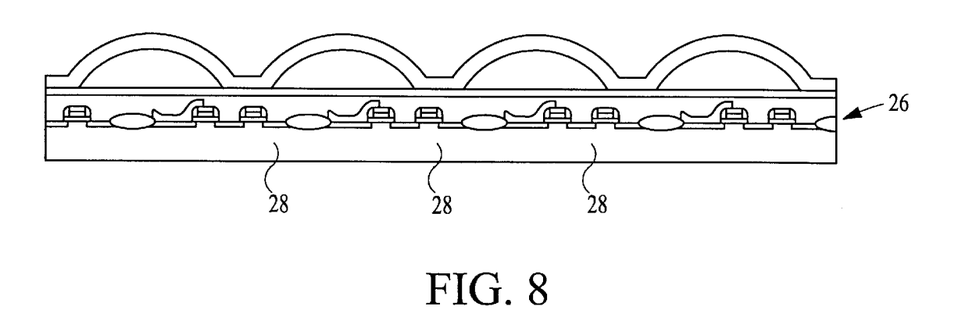
FIG. 8 shows the wafer of FIG. 5 at a processing step subsequent to that shown in FIG. 7.

FIG. 8 shows the next step of the process, in which a transparent insulation layer 72 is formed on the lenses 70 via a low temperature deposition process such as plasma enhanced chemical vapor deposition (CVD). The low temperatures are within the range of approximately 200 to 400 degrees Celsius. The transparent insulation layer 72 may be formed of a silicon insulator such as silicon oxide, silicon nitride, or silicon oxynitride that is transparent to radiation. A CVD process is especially preferred if the transparent insulation layer 72 is formed from silicon oxide, because the CVD process permits the use of tetraethylorthosilicate (TEOS) as the silicon source, as opposed to silane, and therefore results in improved conformal deposition.

The microlens array 22 is essentially complete at this stage, and conventional processing methods may now be performed to package the imager 20. Pixel arrays having the microlens arrays of the present invention, and described with reference to FIGS. 1–8, may be further processed as known in the art to arrive at CMOS, CCD, or other imagers. If desired, the imager 20 may be combined with a processor, such as a CPU, digital signal processor or microprocessor, in a single integrated circuit, and may be used in a processor system such as the typical processor-based system illustrated generally at 400 in FIG. 9. A processor based system is exemplary of a system having digital circuits which could include CMOS or other imager devices. Without being limiting, such a system could include a computer system, camera system, scanner, machine vision system, vehicle navigation system, video telephone, surveillance system, auto focus system, star tracker system, motion detection system, image stabilization system and data compression system for high-definition television, all of which can utilize the present invention.

Figure 9:
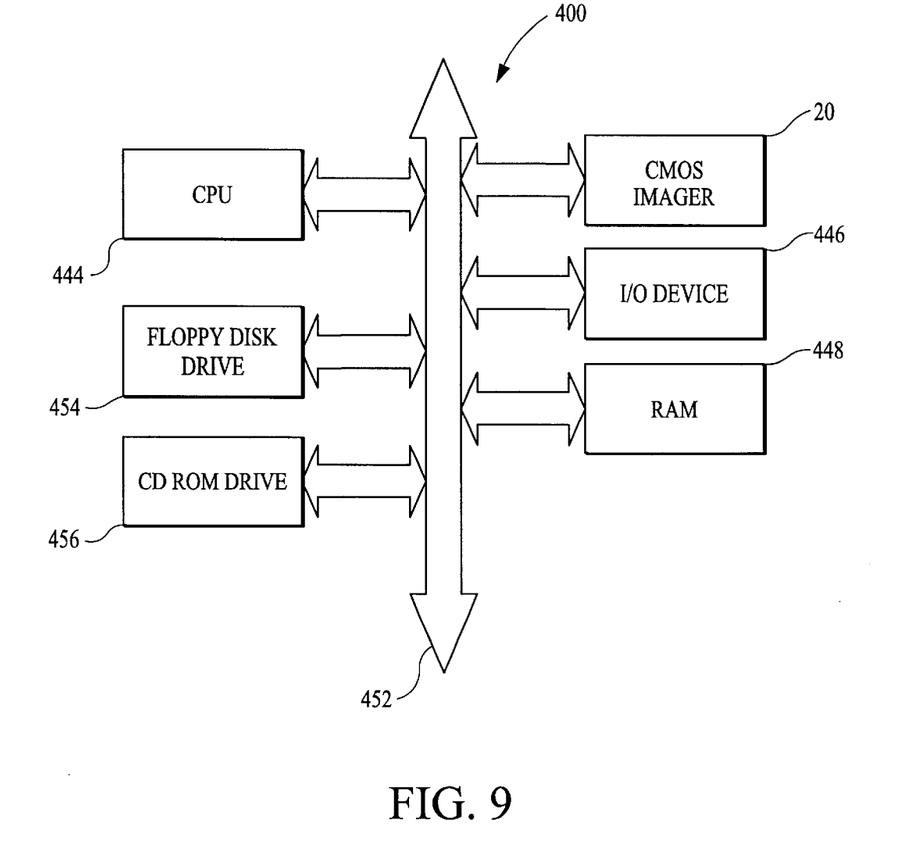
FIG. 9 is an illustration of a computer system having an imager with a microlens array according to the present invention.

As shown in FIG. 9, a processor system such as a computer system, for example, generally comprises a central processing unit (CPU) 444, e.g., a microprocessor, that communicates with an input/output (I/O) device 446 over a bus 452. The imager 20 also communicates with the system over bus 452.

The computer system 400 also includes random access memory (RAM) 448, and, in the case of a computer system may include peripheral devices such as a floppy disk drive 454 and a compact disk (CD) ROM drive 456 which also communicate with CPU 444 over the bus 452. The imager 20 is preferably constructed as an integrated circuit, with or without memory storage, which includes a microlens array 22 having an improved fill factor, as previously described with respect to FIGS. 1 through 9.

As can be seen by the embodiments described herein, the present invention encompasses a microlens array for use in a solid-state imager such as a CMOS imager or CCD imager. The microlens array has an improved fill factor due to the presence of multi-layer lenses having an insulation layer over a refractive layer.

It should again be noted that although the invention has been described with specific reference to imaging circuits having a pixel array, the invention has broader applicability and may be used in any imaging apparatus. Similarly, the process described above is but one method of many that could be used. The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A microlens array for use in an imaging device comprising:
   an imaging array containing photosensitive elements;
   a light condensing layer provided on said imaging array, said light condensing layer having a plurality of microlenses each corresponding to one or more pixels of said array, and wherein said microlenses have convex surfaces facing away from said imaging array; and
   a transparent insulation layer for increasing the proportion of radiation incident on said photosensitive elements of said imaging array, said transparent insulation layer being formed on said light condensing layer by a low temperature process, and wherein said transparent insulation layer has convex surfaces facing away from said microlenses, and wherein said transparent insulation layer includes silicon insulator material.

2. The microlens array of claim 1, wherein said light condensing layer is a layer of optical thermoplastic.

3. The microlens array of claim 2, wherein the optical thermoplastic is selected from the group consisting of polymethylmethacrylate, polycarbonate, polyolefin, cellulose acetate butyrate, and polystyrene.

4. The microlens array of claim 1, wherein said light condensing layer is a layer of polyimide.

5. The microlens array of claim 1, wherein said light condensing layer is a layer of thermoset resin.

6. The microlens array of claim 5, wherein the thermoset resin is an epoxy resin.

7. The microlens array of claim 1, wherein said light condensing layer is a layer of photosensitive gelatin.

8. The microlens array of claim 1, wherein said light condensing layer is a layer of radiation curable resin.

9. The microlens array of claim 8, wherein the radiation curable resin is selected from the group consisting of acrylate, methacrylate, urethane acrylate, epoxy acrylate, and polyester acrylate.

10. The microlens array of claim 1, wherein said transparent insulation layer is formed by a low temperature plasma deposition process.

11. The microlens array of claim 10, wherein the low temperature plasma deposition process is performed at temperatures within the range of approximately 200 to 400 degrees Celsius.

12. The microlens array of claim 1, wherein said transparent insulation layer is a layer of silicon oxide.

13. The microlens array of claim 1, wherein said transparent insulation layer is a layer of silicon nitride.

14. The microlens array of claim 1, wherein said transparent insulation layer is a layer of silicon oxynitride.

15. The microlens array of claim 1, wherein the microlenses are circular lenses.

16. The microlens array of claim 1, wherein the microlenses are lenticular lenses.

17. The microlens array of claim 1, wherein the microlenses are ovoid lenses.

18. The microlens array of claim 1, wherein the microlenses are rectangular lenses.

19. The microlens array of claim 1, wherein the microlenses are hexagonal lenses.

20. The microlens array of claim 1, wherein said microlens has a thickness of from about 0.3 µm to about 5.0 µm.

21. The microlens array of claim 1, further comprising a spacer layer under said light condensing layer.

22. The microlens array of claim 21, wherein said spacer layer has a thickness of from about 1 µm to about 20 µm.

23. A microlens array for use in an imaging device comprising: an array of plano-convex microlenses for converging light onto photosensitive elements, said array of plano-convex microlenses comprising refractive portions having convex surfaces, and a transparent insulation layer for increasing the proportion of radiation incident on said photosensitive elements, said transparent insulation layer being located on said convex surfaces of said refractive portions, and wherein said transparent insulation layer is formed on said convex surfaces by a low temperature process, and wherein said transparent insulation layer has convex surfaces facing away from said refractive portions of said microlenses, and wherein said transparent insulation layer includes silicon insulator material.

24. The microlens array of claim 23 wherein the refractive layer is a layer of optical thermoplastic.

25. The microlens array of claim 24 wherein the optical thermoplastic is selected from the group consisting of polymethylmethacrylate, polycarbonate, polyolefin, cellulose acetate butyrate, and polystyrene.

26. The microlens array of claim 23 wherein the refractive layer is a layer of polyimide.

27. The microlens array of claim 23 wherein the refractive layer is a layer of thermoset resin.

28. The microlens array of claim 23 wherein the refractive layer is a layer of photosensitive gelatin.

29. The microlens array of claim 23 wherein the refractive layer is a layer of radiation curable resin.

30. The microlens array of claim 29 wherein the radiation curable resin is selected from the group consisting of acrylate, methacrylate, urethane acrylate, epoxy acrylate, and polyester acrylate.

31. The microlens array of claim 23 wherein the transparent insulation layer is formed by a low temperature plasma deposition process.

32. The microlens array of claim 31 wherein the low temperature plasma deposition process is performed at temperatures within the range of approximately 200 to 400 degrees Celsius.

33. The microlens array of claim 23 wherein the transparent insulation layer is a layer of silicon oxide.

34. The microlens array of claim 23 wherein the transparent insulation layer is a layer of silicon nitride.

35. The microlens array of claim 23 wherein the transparent insulation layer is a layer of silicon oxynitride.

36. The microlens array of claim 23 wherein the microlenses are circular lenses.

37. The microlens array of claim 23 wherein the microlenses are lenticular lenses.

38. The microlens array of claim 23 wherein the microlenses are ovoid lenses.

39. The microlens array of claim 23 wherein the microlenses are rectangular lenses.

40. The microlens array of claim 23 wherein the microlenses are hexagonal lenses.

41. The microlens array of claim 23 wherein said microlens has a thickness of from about 0.3 µm to about 5.0 µm.

42. The microlens array of claim 23 further comprising a spacer layer under said light condensing layer.

43. The microlens array of claim 42 wherein said spacer layer has a thickness of from about 1 µm to about 20 µm.

44. A solid-state imager comprising:
   an array of pixel sensor cells formed at an upper surface of a substrate;

a protective layer formed over said array; and an array of microlenses formed on said protective layer for converging light on said pixel sensor cells, each microlens comprising a transparent insulation layer formed over a refractive layer, and wherein said transparent insulation layer is formed on said microlenses by a low temperature process, and wherein said transparent insulation layer has curved surfaces, and wherein said refractive layer is located between pixel sensor cells and said transparent insulation layer, such that said light is incident on said curved surfaces of said transparent insulation layer, and wherein said microlenses are arranged such that said insulation layer captures light at the edges of said pixel sensor cells, and wherein said transparent insulation layer includes silicon insulator material.

45. The imager of claim 44, wherein the imager is a CMOS imager.

46. The imager of claim 44, wherein the imager is a CCD imager.

47. The imager of claim 44, wherein said array of microlenses is formed so that each pixel of said array of pixel sensor cells has a corresponding microlens formed above it.

48. The imager of claim 44, further comprising a color filter layer formed over said protective layer and under said array of microlenses.

49. The imager of claim 44, wherein the refractive layer is a layer of material selected from the group consisting of optical thermoplastic, polyimide, thermoset resin, photosensitive gelatin, and radiation curable resin.

50. The imager of claim 49, wherein the optical thermoplastic is selected from the group consisting of polymethylmethacrylate, polycarbonate, polyolefin, cellulose acetate butyrate, and polystyrene.

51. The imager of claim 49, wherein the radiation curable resin is selected from the group consisting of acrylate, methacrylate, urethane acrylate, epoxy acrylate, and polyester acrylate.

52. The imager of claim 44, wherein the transparent insulation layer is formed by a low temperature plasma deposition process.

53. The imager of claim 52, wherein the low temperature plasma deposition process is performed at temperatures within the range of approximately 200 to 400 degrees Celsius.

54. The imager of claim 44, wherein the transparent insulation layer is a layer of silicon oxide.

55. The imager of claim 44, wherein the transparent insulation layer is a layer of silicon nitride.

56. The imager of claim 44, wherein the transparent insulation layer is a layer of silicon oxynitride.

57. An imager comprising:

an imaging array having a plurality of pixel sensor cells formed at an upper surface of a substrate and providing output data representing an image;

an array of microlenses formed on the imaging array, wherein each microlens has a transparent insulation layer vapor deposited by a low temperature process on a convex surface of a refractive layer, and wherein said transparent insulation layer includes silicon insulator material, and wherein said transparent insulation layer has a concave surface and a convex surface, with said concave surface of said transparent insulation layer being located between said convex surface of said refractive layer and said convex surface of said transparent insulation layer, such that said transparent insulation layer increases the proportion of radiation incident on said pixel sensor cells; and a processor for receiving and processing data representing the image.

58. The imager of claim 57, wherein said arrays and said processor are formed on a single substrate.

59. The imager of claim 57, wherein said arrays are formed on a first substrate and said processor is formed on a second substrate.

* * * * *